(12) United States Patent
Heminger et al.

(10) Patent No.: US 6,504,424 B1
(45) Date of Patent: Jan. 7, 2003

(54) LOW VOLTAGE METAL OXIDE SEMICONDUCTOR THRESHOLD REFERENCED VOLTAGE REGULATOR AND METHOD OF USING

(75) Inventors: David M. Heminger, Mesa, AZ (US); Stephen P. Robb, Tempe, AZ (US); Margaret E. Fuchs, Mesa, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/942,053

(22) Filed: Aug. 29, 2001

(51) Int. Cl.$^7$ .............................................. H01L 25/00
(52) U.S. Cl. ...................................... 327/566; 327/312
(58) Field of Search ................................ 323/315, 316, 323/317, 907, 281, 280; 327/566, 564, 309, 589, 274, 192, 209, 312

(56) References Cited

U.S. PATENT DOCUMENTS

| | | | |
|---|---|---|---|
| 4,267,501 A | * | 5/1981 | Smith ........................ 323/313 |
| 4,318,040 A | * | 3/1982 | Hilbourne .................... 323/312 |
| 4,390,833 A | * | 6/1983 | Tzeng ........................ 323/280 |
| 5,272,399 A | * | 12/1993 | Tihanyi et al. .............. 323/274 |

* cited by examiner

Primary Examiner—Shawn Riley

(57) ABSTRACT

Depletion mode pass transistor (38) accepts input voltage $V_{in}$ and provides regulated output voltage $V_{out}$. The regulated output voltage is referenced to the threshold voltage of MOSFET (40) and is directly proportional to the ratio of resistors (50 and 52). MOSFET (58) provides enabling and disabling of voltage regulator (54). Multiple voltage regulators (FIG. 5) having multiple output potentials are realized on the same semiconductor die producing the same threshold potential for MOSFET's (40), whereby the output potentials are selectable using the ratio of resistors 50 and 52. Constant current source (56) reduces output voltage variation due to input voltage variation.

10 Claims, 6 Drawing Sheets

LOW VOLTAGE METAL OXIDE SEMICONDUCTOR THRESHOLD REFERENCED VOLTAGE REGULATOR AND METHOD OF USING

BACKGROUND OF THE INVENTION

The present invention relates in general to voltage regulators and, more particularly, to low voltage regulators using the threshold voltage of Metal Oxide Semiconductor Field Effect Transistors (MOSFET) to regulate the output potential.

Most, if not all, electronic devices require at least one Direct Current (DC) voltage for proper operation. Many portable electronic devices require two or more levels of DC potential to operate properly, such as Compact Disc (CD) or Moving Picture Experts Group Audio Layer-3 (MP3) format players, for example. Each DC potential is derived from a battery power supply or an Alternating Current (AC) to DC conversion power supply. Multiple voltage regulators, therefore, are employed to generate the various DC potentials required by the CD or MP3 players. The voltage regulators are referenced to the single battery or AC-DC power supply input, where a separate voltage regulator is required to generate each level of DC potential required by the portable electronic device.

FIG. 1 illustrates prior art regulator 10 utilizing bipolar transistor 14 as the pass element and zener diode 16 as the reference element. In operation, an input voltage is applied to terminal $V_{in}$, which is larger than the breakdown voltage, $V_z$, of zener diode 16. The base terminal potential of transistor 14 is held relatively constant at $V_z$, causing transistor 14 to be conductive. The output voltage, $V_{out}$, of prior art regulator 10 is equal to $V_z-V_f$, where $V_f$ is the emitter-base potential of transistor 14. Resistor 12 limits the current flow conducted by zener diode 16 when operating at the breakdown voltage $V_z$.

Zener diode 16 operates in the reverse biased, breakdown region and as a result, a reverse leakage current is present due to minority carriers being present within the vicinity of the depletion region. Prior art regulator 10 is subsequently used in applications requiring greater than 5 volt regulated output voltages, since the reverse leakage current is minimal in relatively high output voltage ranges. Applications requiring less than 5 volts, however, increases the amount of reverse leakage current conducted by zener diode 16, which precludes their use in low voltage applications (<5 volts), where leakage current conducted by zener diode 16 is generally in the milliamp (mA) range.

Hence, there is a need for a simple, low voltage reference, exhibiting low current drain, thereby decreasing power dissipation and increasing efficiency.

DETAILED DESCRIPTION OF THE DRAWINGS

Figure 2:
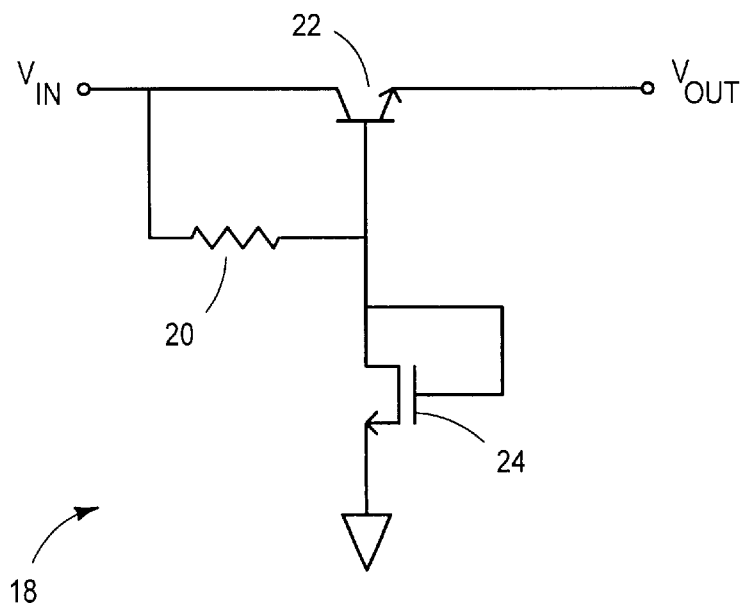
FIG. 2 is a schematic diagram illustrating a voltage regulator utilizing a MOSFET device in place of a zener diode.

In FIG. 2, voltage regulator 18 is illustrated utilizing MOSFET 24 having gate and drain terminals coupled together at the base terminal of NPN pass transistor 22. A first conductor of resistor 20 is coupled to terminal $V_{in}$ and the collector terminal of transistor 22 and a second conductor of resistor 20 is coupled to the base terminal of transistor 22. The source terminal of MOSFET 24 is coupled to, for example, ground potential. The regulated output potential is generated at the emitter terminal of transistor 22.

Figure 1:
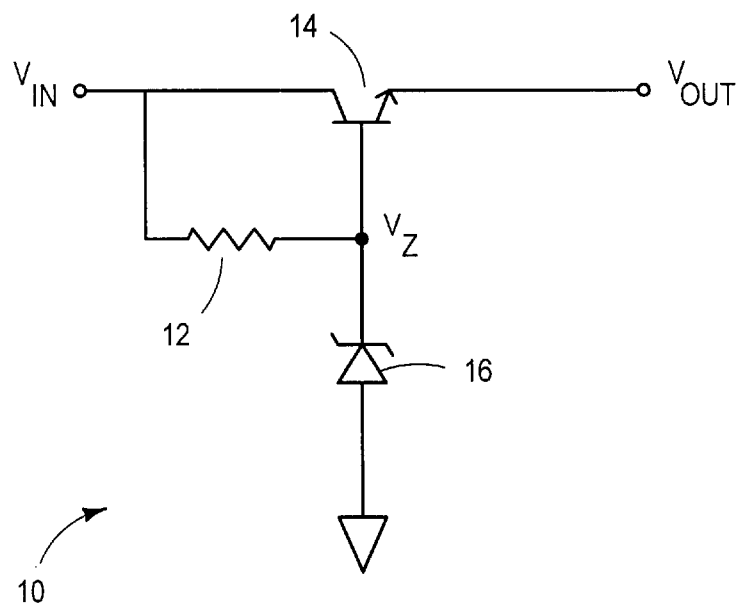
FIG. 1 is a schematic diagram illustrating a prior art voltage regulator utilizing a zener diode.

In operation, voltage regulator 18 receives an input voltage at terminal $V_{in}$. As the input voltage at terminal $V_{in}$ increases, the voltage at the drain and gate terminals of MOSFET 24 increases. Once the voltage at the gate terminal, with respect to the source terminal, of MOSFET 24, exceeds the threshold voltage of MOSFET 24, MOSFET 24 transitions to the conductive state, allowing current to flow through resistor 20 and MOSFET 24, thereby substantially clamping the voltage at the base terminal of pass transistor 22 to the threshold voltage, $V_{thresh}$, of MOSFET 24. The output voltage at terminal $V_{out}$ is given by $V_{out}=V_{thresh}-V_f$, where $V_f$ is the forward voltage across the emitter-base junction of pass transistor 22. The voltage regulator of FIG. 2 provides for a decrease in leakage current relative to the prior art voltage regulator of FIG. 1, since zener diode 16 of FIG. 1 is replaced by MOSFET 24 of FIG. 2. One disadvantage, however, of the circuit of FIG. 2, is the excessive drop out voltage required by the forward potential, $V_f$, of the emitter-base junction of pass transistor 22. In other words, the output voltage, $V_{out}$, of voltage regulator 18, is diminished by $V_f$, thereby increasing the drop out voltage of voltage regulator 18.

Figure 3:
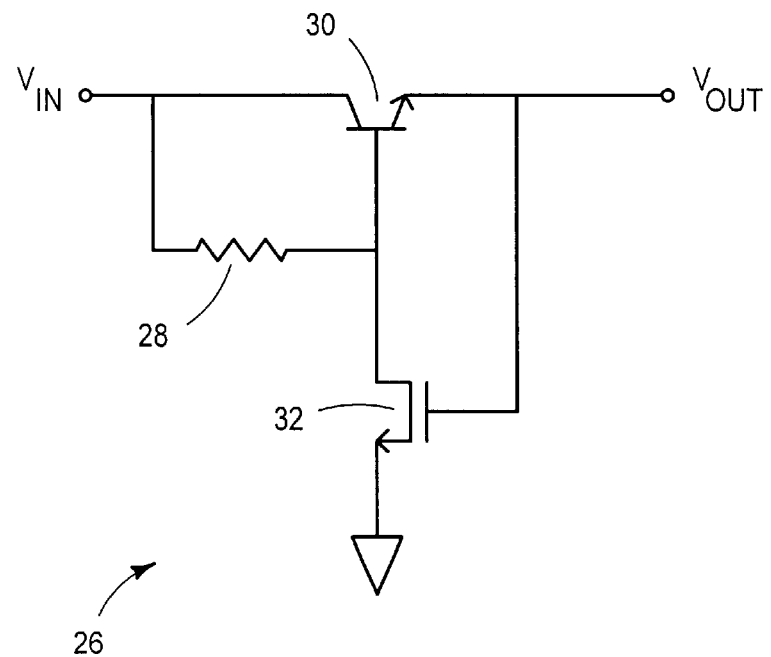
FIG. 3 is a schematic diagram illustrating an alternate voltage regulator similar to FIG. 2.

Turning to FIG. 3, voltage regulator 26 is configured to remove the regulated output voltage dependence on the forward potential $V_f$ of the emitter-base junction of pass transistor 30. The gate terminal of MOSFET 32 is no longer coupled to the base terminal of pass transistor 30, but is directly coupled to output terminal $V_{out}$.

In operation, voltage regulator 26 receives an input voltage at terminal $V_{in}$. As the voltage at the base terminal of pass transistor 30 forward biases the emitter-base junction of pass transistor 30, pass transistor 30 transitions to the conductive state, causing the gate potential, with respect to the source potential, of MOSFET 32 to exceeds the threshold voltage, $V_{thresh}$, of MOSFET 32. MOSFET 32 substantially clamps the voltage at terminal $V_{out}$ to the threshold potential of MOSFET 32, such that $V_{out}=V_{thresh}$, thereby removing a portion of regulated output voltage caused by the emitter-base junction potential drop of pass transistor 30.

A disadvantage, however, of the voltage regulator of FIG. 3, is the variation of the regulated output voltage due to variation in load current sourced from terminal $V_{out}$. A current gain of pass transistor 30, for example, of 100, requires 1/100th of the collector current of pass transistor 30 to be conducted by the base terminal of pass transistor 30. Variations in the amount of load current conducted by pass transistor 30, causes MOSFET 32 to conduct variable amounts of current, which causes variations in the threshold voltage of MOSFET 32. The regulated output potential at } terminal $V_{out}$, therefore, varies according to output load current. Implementation variations of pass transistor 30, such as a modified Darlington pair arrangement for gain improvement, can be used to reduce the amount of pass transistor base current conducted by MOSFET 32. Reducing the amount of base current conducted by MOSFET 32 substantially reduces the magnitude of regulated output voltage variation due to load current.

Figure 4:
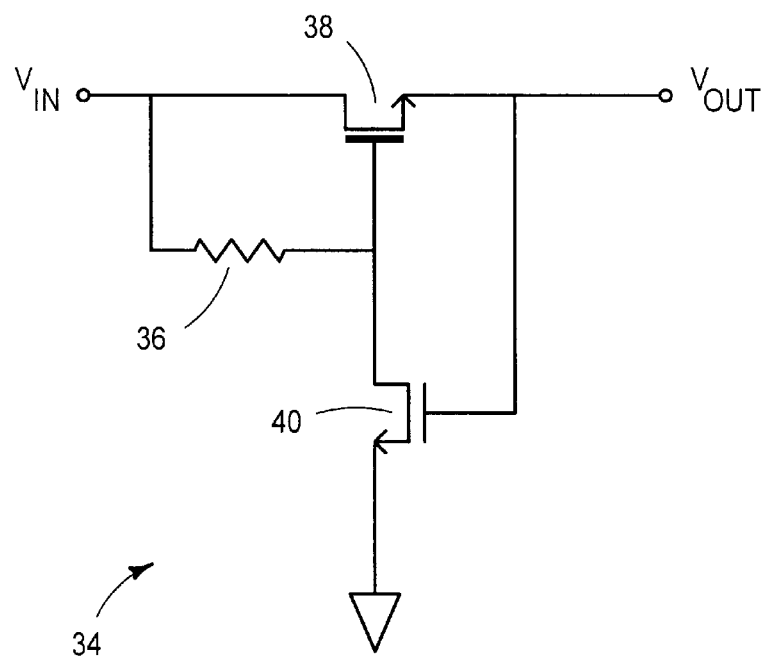
FIG. 4 is a schematic diagram illustrating a voltage regulator using a depletion mode transistor as the pass element.

Turning to FIG. 4, voltage regulator 34 employs depletion mode MOSFET 38 as the pass transistor element. The drain of pass transistor 38 is coupled to terminal $V_{in}$ and a first terminal of resistor 36. The gate terminal of pass transistor 38 is coupled to the drain terminal of enhancement mode MOSFET 40 and a second terminal of resistor 36. The source terminal of enhancement mode MOSFET 40 is coupled to, for example, ground potential. The gate terminal of MOSFET 40 is coupled to terminal $V_{out}$.

In operation, voltage regulator 34 utilizes depletion mode MOSFET 38 as the pass transistor element. Use of a depletion mode transistor as the pass element provides an implementation, which minimizes drop out of voltage regulator 34. In fact, the potential difference between terminal $V_{in}$ and $V_{out}$ is substantially 0 volts without restricting current flow into terminal $V_{out}$, since pass transistor 38 provides a negative threshold, allowing a zero or negative gate voltage, with respect to the source voltage.

Regulator 34 accepts an input voltage at terminal $V_{in}$ and provides a regulated output voltage at terminal $V_{out}$. Once the potential at terminal $V_{out}$ is greater than the threshold potential of MOSFET 40, the potential present at terminal $V_{out}$ is substantially clamped to the threshold potential of MOSFET 40, due to the conductive state of MOSFET 40, where the current conducted by MOSFET 40 is essentially set by resistor 36. Since pass transistor 38 is a depletion mode MOSFET, the input voltage at terminal $V_{in}$ can be substantially equal to the threshold voltage of MOSFET 40 present at terminal $V_{out}$, such that $V_{in} >= V_{out}$, while maintaining load current to terminal $V_{out}$. The voltage at terminal $V_{out}$ must, however, exceed the pinch-off voltage of pass transistor 38 in order for normal voltage regulation to occur. Once the voltage at terminal $V_{out}$ falls below the pinch-off voltage of pass transistor 38, current ceases to flow through pass transistor 38 and voltage regulation ceases.

Several advantages exist for the voltage regulator of FIG. 4. First, since pass transistor 38 is a depletion mode MOSFET, the drop out voltage of voltage regulator 34 is substantially eliminated such that $V_{in} >= V_{out}$, while maintaining output load current. Typical values for input voltage $V_{in}$ are, for example, 3–5 volts. The output voltage, $V_{out}$, ranges from a voltage equal to the input voltage down to a minimum of, for example, 0.5 volts. The lower limit being set by the threshold voltage of MOSFET 40. Second, the gate terminal of pass transistor 38 provides capacitive properties, therefore, a minimum amount of gate current is required to maintain the conductive state of pass transistor 38. Reducing the amount of gate current required by pass transistor 38 reduces the amount of current conducted by MOSFET 40, which reduces the regulated output voltage variation at terminal $V_{out}$, with respect to load current.

Figure 5:
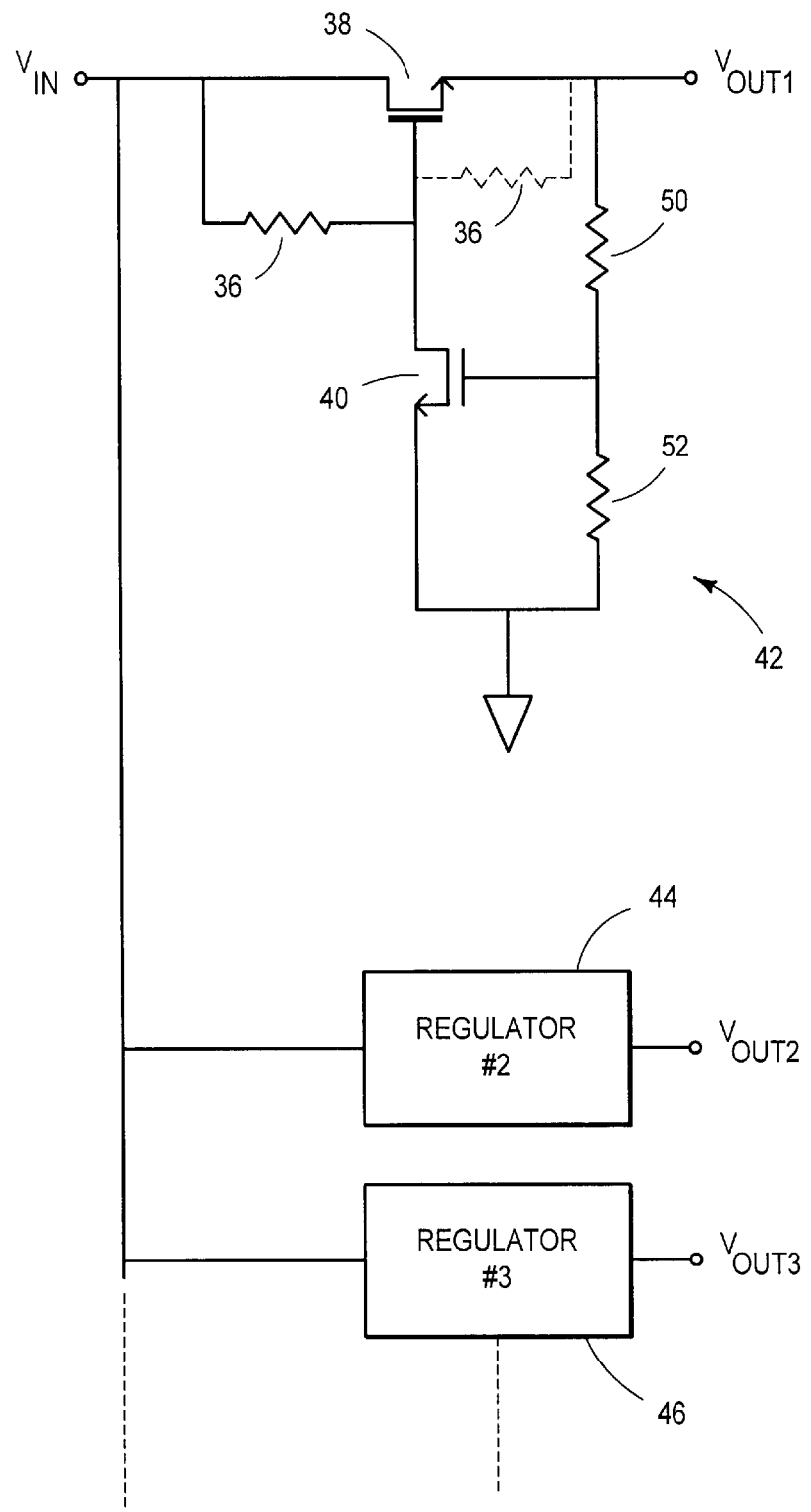
FIG. 5 is a schematic diagram illustrating a multiple output voltage regulator.

Turning to FIG. 5, voltage regulator 42 is illustrated, which is identical to voltage regulator 34, with the exception of output resistors 50 and 52. Resistors 50 and 52 are added in series combination, where first conductors of resistors 50 and 52 are coupled together at the gate terminal of MOSFET 40. The second conductor of resistor 50 is coupled to terminal $V_{out}$ and the second conductor of resistor 52 is coupled to, for example, ground potential.

The output voltage of voltage regulator 42 is set by the threshold voltage of MOSFET 40 in combination with resistors 50 and 52. Since the gate terminal of MOSFET 40 operates near the threshold voltage of MOSFET 40, $V_{out}$ is expressed as $V_{out} = (1 + R_{50}/R_{52}) * V_{thresh}$, where $R_{50}$ is the resistance of resistor 50, $R_{52}$ is the resistance of resistor 52 and $V_{thresh}$ is the threshold voltage of MOSFET 40. It can be seen, therefore, that the regulated output voltage of voltage regulator 42 is essentially set by the voltage ratio of resistors 50 and 52. If, for example, the threshold voltage of MOSFET 40 is set to be 1 volt, with the ratio of resistors 50 to 52 set to 210/50=4.2, a regulated output voltage of voltage regulator 42 is realized at approximately 5.2 volts. If a lower output voltage is desired, for example, the ratio of resistors 50 and 52 is reduced to 1, yielding a regulated output voltage of 2 volts.

The threshold voltage of MOSFET 40 has a negative temperature coefficient, such that the threshold voltage of MOSFET 40 decreases with increasing temperature. Voltage regulator 42, therefore, has a negative temperature coefficient as well, provided that the ratio of resistors 50 and 52 are held constant over temperature. Temperature compensation is readily available for voltage regulator 42, if the ratio of resistors 50 and 52 is made to increase with increasing temperature, or positive temperature coefficient, which offsets the negative temperature coefficient of MOSFET 40. $P^+$ and $P^-$ polysilicon is used to implement resistors 50 and 52. $P^+$ polysilicon has a positive temperature coefficient of resistance and $P^-$ polysilicon has a negative temperature coefficient of resistance. If resistor 50 is implemented with $P^+$ polysilicon and resistor 52 is implemented with $P^-$ polysilicon, then the ratio $R_{50}/R_{52}$ provides a positive temperature coefficient effective to substantially cancel the negative temperature coefficient of the threshold voltage of MOSFET 40. Furthermore, if resistor 36 is implemented with $P^-$ polysilicon, then the current through MOSFET 40 increases with increasing temperature, which also tends to increase the voltage across MOSFET 40 with increasing temperature, providing an additional technique to offset the negative temperature coefficient of MOSFET 40.

One variation of voltage regulator 42, includes placing resistor 36 across the source-gate terminals of pass transistor 38, as opposed to across the drain-gate terminals of pass transistor 38, as shown by the ghosted image of resistor 36 in FIG. 5. The placement of ghosted resistor 36 results in biasing the gate terminal of pass transistor 38, via resistor 36, with the regulated output voltage of regulator 42. In addition, the current conducted by MOSFET 40 is substantially constant, which improves voltage regulation, since threshold voltage variation of MOSFET 40 is minimized due to the constant current conducted by MOSFET 40. It should be noted that placement of resistor 36 is only placed in one of the positions shown in FIG. 5.

Multiple output voltages are possible using voltage regulators 44, 46, etc. as shown in FIG. 5. Voltage regulators 44, 46 etc. are identical to voltage regulator 42, with the exception of the ratio of resistors 50 and 52. The output voltages of each voltage regulator is set by the ratio of resistors 50 and 52 as discussed above. The number of voltage regulated outputs of FIG. 5 is limited only by the packaging selected for voltage regulators 42, 44, 46 etc. Regulators 44, 46, etc. are coupled in parallel to regulator 42, such that the drain terminal of the pass transistor elements are coupled to common input terminal $V_{in}$. Coupling the drain terminals of pass transistor elements of voltage regulators 42, 44, 46, etc. allows the integrated circuit implementation of FIG. 5 to occur on a single, semiconductor die, where the pass transistor elements are implemented as vertical MOSFET's in order to maximize current conduction capability. In addition, all MOSFET transistors 40, are implemented with a single process step to develop a single threshold voltage, which reduces manufacturing complexity.

Figure 6:
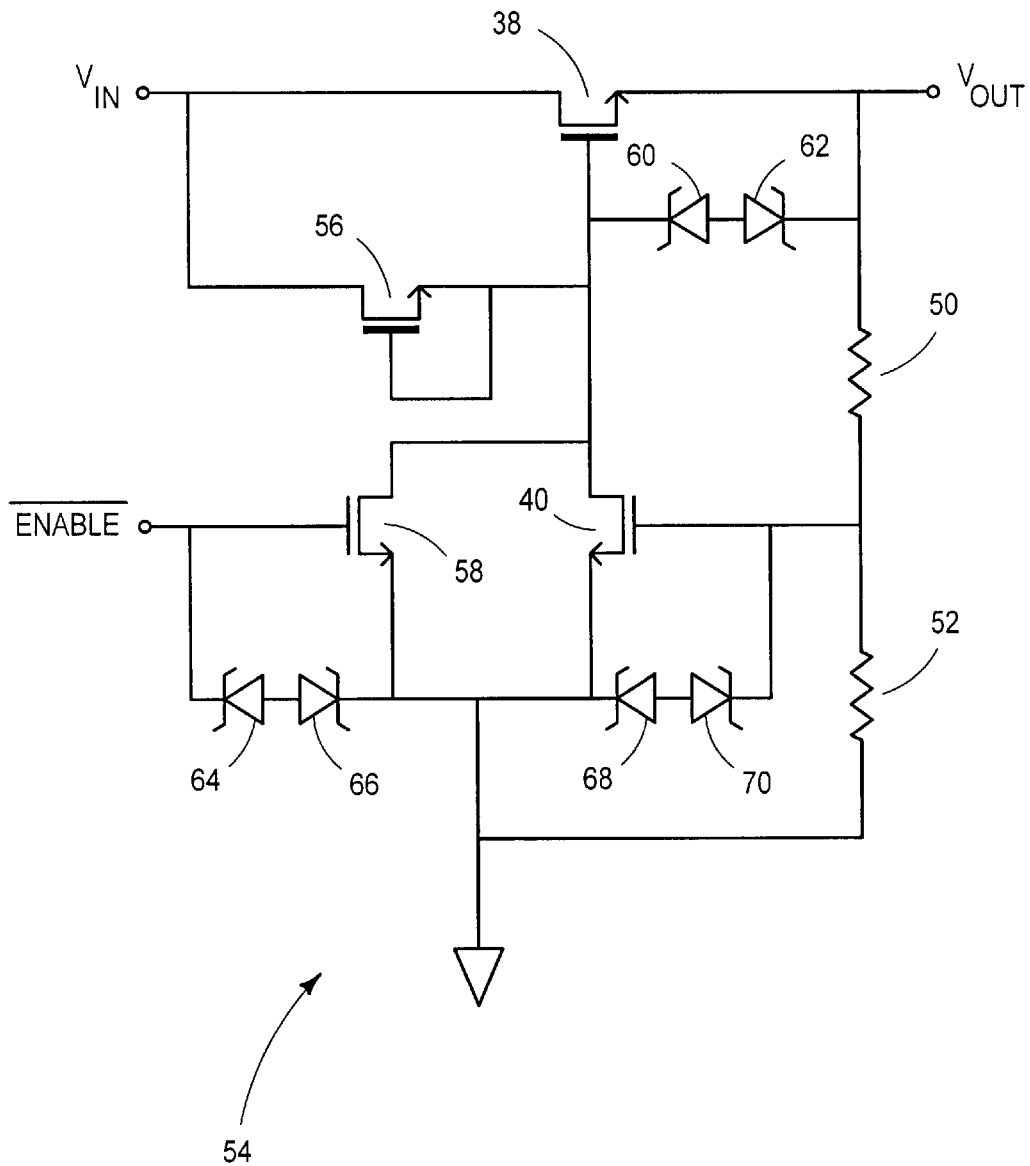
FIG. 6 is a schematic diagram illustrating a voltage regulator exhibiting immunity from input voltage variation.

FIG. 6 illustrates a voltage regulator 54 having pass transistor 38, MOSFET 40 and resistors 50 and 52 as described in voltage regulator 42 of FIG. 5. Back to back Electro-Static Discharge (ESD) diodes 60, 62; 64, 66 and 68,70 are provided for ESD protection of terminals $V_{out}$, ENABLE and the ground terminal, for example, by placement of the ESD diodes across gate and source terminals of transistors 38, 58 and 40, respectively. Pass transistor 38 is advantageously implemented using a vertical process, as opposed to a lateral process, in order to maximize current conduction capability of pass transistor 38. Input resistor 38 of FIG. 5 is replaced by MOSFET 56, where the drain terminal of MOSFET 56 is coupled to terminal $V_{in}$ and the drain terminal of pass transistor 38 and the gate and source terminals of MOSFET 56 are coupled together at the gate terminal of pass transistor 38. MOSFET 58 is coupled in parallel to MOSFET 40 having drain and source terminals coupled directly to drain and source terminals of MOSFET 40. The gate terminal of transistor 58 is coupled to terminal ENABLE.

MOSFET 56 is coupled to provide a source of constant current to the drain terminal of MOSFET 40, substantially independent of the input voltage present at terminal $V_{in}$. Elimination of resistor 36 of FIG. 5 by MOSFET 56 has several advantages. First, resistor 36 has a resistance value of approximately 1 megohm and requires a larger amount of die area to implement as compared to MOSFET 56. Second, the current conducted by resistor 36 is dependent upon input voltage at terminal $V_{in}$. Variations in current conducted by resistor 36, tends to change the threshold voltage of transistor 40, thereby allowing variations in the regulated output potential at terminal $V_{out}$. MOSFET 56 provides a source of constant current, substantially independent of the input voltage present at terminal $V_{in}$, to be conducted by MOSFET 40, which yields a tighter control on regulated output voltage variance.

MOSFET 58 provides an enable function for voltage regulator 54. A logic high value present at terminal ENABLE allows MOSFET 58 to transition to a conductive state. The conductive state of MOSFET 58 is effective to pull the voltage at the gate terminal of pass transistor 38 to ground potential, thereby disabling the load (not shown) connect to terminal $V_{out}$. Terminal ENABLE can be made to accept an active logic high enable signal by adding an additional MOSFET (not shown) to invert the enable signal at terminal ENABLE, such that a logic high enable signal activates voltage regulator 54. A logic high value present at terminal ENABLE would then allow MOSFET 58 to transition to a non-conductive state, which enables MOSFET 40 to provide regulated output voltage control to terminal $V_{out}$.

Figure 7:
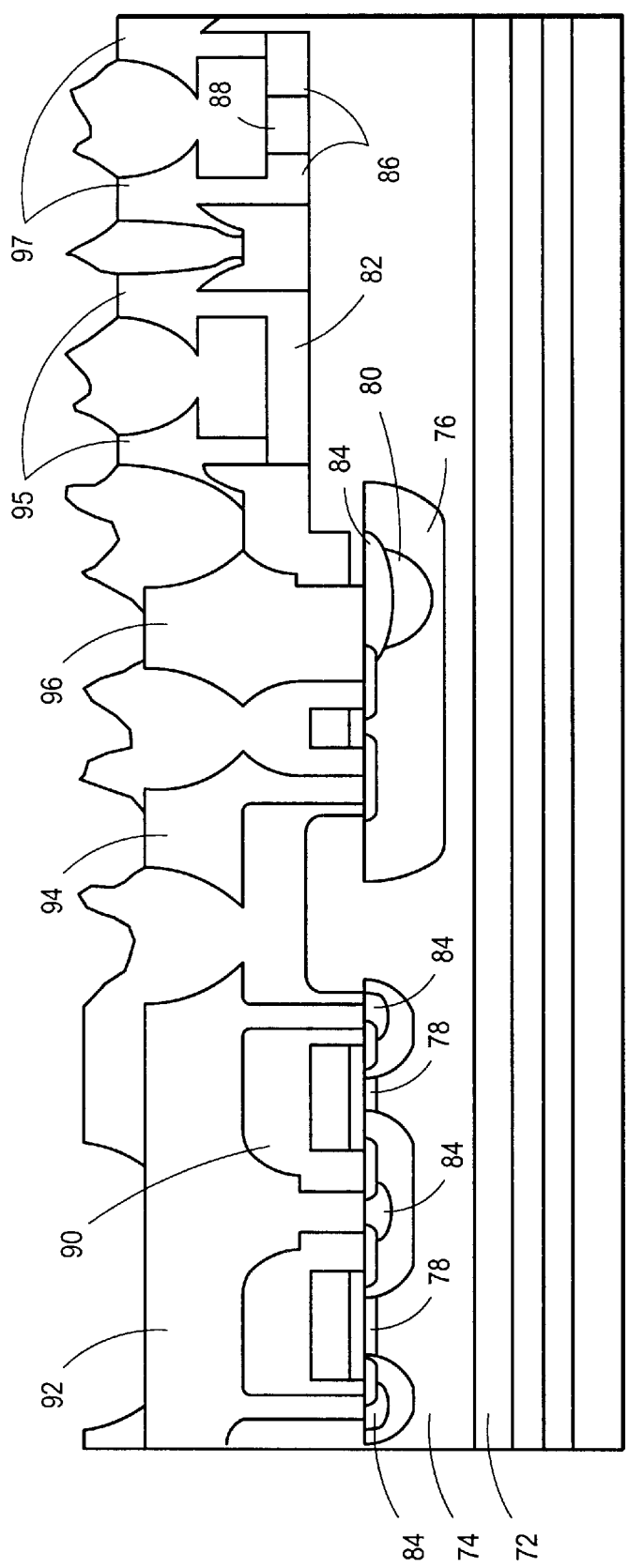
FIG. 7 is a cross-sectional view of the voltage regulator of FIG. 5.

The voltage regulator of FIG. 5 requires manufacturing vertical, depletion mode pass transistor 38 with the integration of lateral MOSFET device 40 as illustrated in FIG. 7. The manufacturing process generally follows a power MOSFET manufacturing flow, which starts with an $N^+$ doped semiconductor substrate 72, having an $N^-$ epitaxial layer 74 formed on a major surface of the semiconductor substrate. An initial oxide layer is formed above the epitaxial layer and subsequently patterned to provide a boron implanted, P-well region 76 on the major surface of the semiconductor substrate to allow for lateral N-type MOSFET integration.

P-well region 76 is implanted with boron at, for example, a concentration of between 1.0e13 to 5.0e13 and energy level of between 20–60 kiloelectron volts (keV). A patterned, photoresist layer is applied to epitaxial layer 74, after forming P-well region 76, which exposes a portion of epitaxial layer 74. Depletion regions 78 are formed adjacent to P-well region 76 in epitaxial layer 74, using an arsenic or antimony implant of, for example, between 4.0e12 to 8.0e12 concentration and energy level of 20–60 keV in the exposed region of epitaxial layer 74. Arsenic and antimony are advantageous N-type implant materials for depletion regions 78 as opposed to phosphorous, for example, since arsenic and antimony exhibit tighter diffusion characteristics allowing tighter control of the diffusion depth of depletion regions 78. $P^-$ type High Voltage (PHV) region 80 is formed using a boron implant, between 2.0e13 to 8.0e13 concentration at an energy level of 40–100 keV for example, which forms $P^-$ polysilicon resistor 52. A $P^+$ implantation of boron, at for example, between 1.0e14 to 5.0e15 concentration and 30–80 keV energy level, forms $P^+$ polysilicon resistor 50 within region 82. Source regions 84 are formed using a boron implant of, for example, between 1.0e14 to 1.0e15 concentration and 30–80 keV energy level, as well as forming the cathode regions 86 30 of ESD diodes 60 and 62. Anode regions 88 of ESD diodes 60 and 62 are formed using an arsenic implant at, for example, a concentration of between 5.0e15 to 8.0e16 and between 30–80 keV energy level. Inter-layer Dielectric (ILD) is applied at approximately 10 kiloangstroms to isolate contact regions of vertical MOSFET 38, lateral MOSFET 40, ESD diodes 60 and 62, $P^-$ resistor 52 and $P^+$ resistor 50. A metalization layer is applied to form source contact 92 of vertical pass transistor 38, drain contact 94 of MOSFET 40, source contact 96 of MOSFET 40, terminal contacts 95 to $P^+$ resistor 50 and cathode contacts 97 for ESD diodes 60 and 62.

Figure 8:
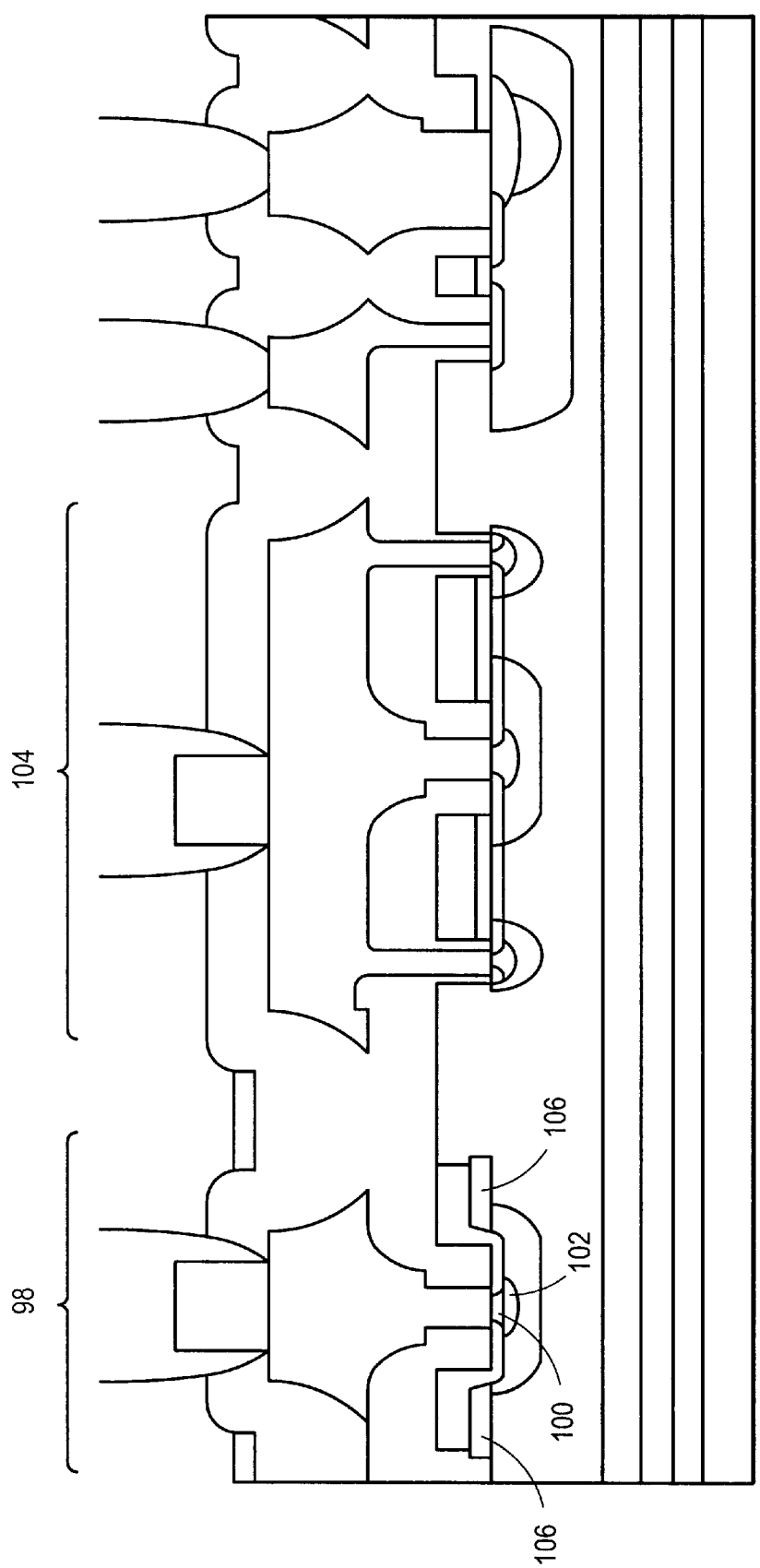
FIG. 8 is a cross-sectional view of the constant current source of FIG. 6.

FIG. 8 illustrates vertical MOSFET 98, which is the implementation of constant current source 56. Vertical MOSFET device 104 represents the implementation of pass transistor 38. Vertical MOSFET 98 is a single cell split off of vertical MOSFET 104, isolated by ILD 90, whereby gate region 106 and source region 102 are coupled in short circuit mode and self-biased to provide a source of constant current. As discussed above, constant current source 56 substantially eliminates regulated output voltage variation due to input voltage variation.

In summary, a MOSFET threshold referenced, voltage regulator implemented on a single semiconductor die having vertical, depletion mode MOSFET's and integrated lateral, enhancement mode MOSFET's has been presented. The voltage regulator exhibits low voltage operation (<5 volts) with low drop out performance. Temperature compensation using $P^+$ and $P^-$ polysilicon resistors effectively offsets the temperature coefficient of the lateral MOSFET devices. Multiple voltage regulators are realized on the same semiconductor die, whereby the regulated output voltage is selectable using an output voltage divider implemented with the $P^+$ and $P^-$ polysilicon resistors. Regulated output voltage variation is minimized through the use of a constant, input current source operating substantially independent of input voltage.

What is claimed is:

1. In an integrated circuit, a voltage regulator implemented on a single semiconductor die, the voltage regulator comprising:
   a first depletion mode device (56)coupled to receive an input signal and coupled to provide a constant output signal substantially independent of the input signal;

a first enhancement mode device (40) having a first conductor coupled to receive the constant output signal;

a second depletion mode device (38) having a first conductor coupled to receive the input signal and a second conductor coupled to provide a regulated output signal substantially dependent upon a threshold potential of the first enhancement mode device;

a first resistor coupled between the second conductor of the second depletion mode device and a control electrode of the first enhancement device, and having a first temperature coefficient of resistance; and a second resistor coupled between the control electrode and a second conductor of the first enhancement mode device and having a second temperature coefficient of resistance less positive than the first temperature coefficient of resistance.

2. The voltage regulator of claim 1 wherein the second depletion mode device includes a MOSFET with a negative threshold such that the regulated output signal is substantially equal to or lower than the input signal.

3. The voltage regulator of claim 1 wherein the first and second resistors operate as a voltage divider coupled to provide adjustment of the regulated output signal.

4. The voltage regulator of claim 3 wherein the voltage divider offsets a negative temperature coefficient of the first enhancement mode device.

5. The voltage regulator of claim 1, wherein the second depletion mode device is formed on the semiconductor die as a vertical transistor.

6. In an integrated circuit, a voltage regulator implemented on a single semiconductor die, the voltage regulator comprising:

a first enhancement mode transistor;

a first vertical transistor having a drain formed on a first surface of the semiconductor die for receiving an input voltage, a source formed on a second surface of the semiconductor die for providing a first regulated voltage, and a gate coupled to a drain of the first enhancement mode transistor; and a first voltage divider providing a first resistance between the source of the first vertical transistor and a gate of the first enhancement mode resistor and having a first temperature coefficient, and a second resistance between the gate and a source of the first enhancement mode transistor and having a second temperature coefficient.

7. The voltage regulator of claim 6, wherein the second temperature coefficient is less than the first temperature coefficient.

8. The voltage regulator of claim 6, further comprising a resistor coupled between the drain of the first vertical transistor and the drain of the first enhancement mode transistor.

9. The voltage regulator of claim 6, wherein the first vertical transistor comprises a first depletion mode transistor.

10. The voltage regulator of claim 9, further comprising;

a second enhancement mode transistor;

a second depletion mode transistor having a drain formed on the first surface for receiving the input voltage, a source formed on the second surface for providing a second regulated voltage, and a gate coupled to a drain of the second enhancement mode transistor; and a second voltage divider providing a third resistance between the source of the second depletion mode transistor and a gate of the second enhancement mode resistor and having a third temperature coefficient, and a fourth resistance between the gate and a source of the second enhancement mode transistor and having a fourth temperature coefficient less than the third temperature coefficient.

* * * * *